United States Patent [19]

Van Zanten

[11] Patent Number: 4,705,966

[45] Date of Patent: Nov. 10, 1987

[54] CIRCUIT FOR GENERATING A SUBSTRATE BIAS

[75] Inventor: Adrianus T. Van Zanten, Eindhoven, Netherlands

[73] Assignee: U.S. Philips Corporation, New York, N.Y.

[21] Appl. No.: 772,790

[22] Filed: Sep. 5, 1985

[30] Foreign Application Priority Data

Sep. 11, 1984 [NL] Netherlands ........................ 8402764

[51] Int. Cl.$^4$ ................................ H03K 3/01

[52] U.S. Cl. ................................ 307/296 R; 307/297; 307/200 B

[58] Field of Search ............... 307/296 R, 297, 200 B; 323/313, 314

[56] References Cited

U.S. PATENT DOCUMENTS 4,438,346 3/1984 Chuang et al. ...................... 307/269

4,454,571 6/1984 Miyashita ........................ 307/200 B 4,585,954 4/1986 Hashimoto et al. ................ 307/297

*Primary Examiner*—Stanley D. Miller

*Assistant Examiner*—Trong Quang Phan

*Attorney, Agent, or Firm*—Robert T. Mayer; Bernard Franzblau

[57] ABSTRACT

A substrate bias generator in which a junction point of the capacitance and the diode of a charge pump is connected to the ground point of the circuit (and of the further circuit on the substrate for which the bias is generated) via two or more series-connected transistors. During the charging period of the capacitance the transistors are (fully) conductive, hence the capacitance is optimally charged as the conductive transistors cause no (or hardly any) voltage drop. During the pumping cycle all transistors are diode-connected, to bring about a negative voltage with respect to the ground point at the junction point. This negative voltage is limited to the sum of the threshold voltages of the diode-connected transistors.

19 Claims, 2 Drawing Figures

CIRCUIT FOR GENERATING A SUBSTRATE BIAS

BACKGROUND OF THE INVENTION

This invention relates to a circuit for generating a bias voltage for another circuit which is integrated on a semiconductor substrate. The first-mentioned circuit comprises an oscillator for generating control pulses and at least one charge pump to which electrical pulses derived from the control pulses are applied. The charge pump comprises a series arrangement of a capacitance and a diode. The electrical pulses are applied to a first electrode of the capacitance, whose second electrode is connected to the diode associated with the capacitance. An output of the charge pump is connected to the substrate and the junction point of the capacitance and the diode of the charge pump is connected to the ground point of the integrated circuit via a channel of an insulated-gate switching transistor whose gate is connected to a control circuit which receives the control pulses.

Such a circuit is known from U.S. Pat. No 4,438,346. In the prior art circuit, the control electrode of the transistor, which connects the junction point of the capacitance and the diode of the charge pump to the ground point, is connected to a junction point of two series-arranged, diode-connected transistors which interconnect the ground point and a junction point carrying the negative substrate voltage. Hence, the control electrode is at a negative potential when there are no control pulses, thus causing the transistor to remain in the cut-off state if the voltage at the junction point in the charge pump decreases to a value which lies more than one threshold voltage of said transistor below ground potential. Thus, during a pumping cycle efficient use is made of the charge stored in the capacitance. However, in order to charge the capacitance, the negatively-biassed transistor must be rendered conductive. In said circuit this is achieved by means of control pulses which are applied to the control electrode of the transistor via a capacitor and which exceed the supply voltage.

For generating such control pulses, a relatively complex control circuit is needed in which the required voltage levels of the control pulses can be generated by means of bootstrap techniques.

However, the said U.S. Patent also describes steps, whereby the control pulses, generated by the relatively complex control circuit, are no longer needed. The control electrode of the switching transistor is connected to the ground point via the junction point of the capacitance and the diode of the charge pump. However, this circuit, which is known per se, has the disadvantage that the capacitance is charged to a maximum of $V_{DD}-2\ V_{TH}$ ($V_{DD}$ is the supply voltage and $V_{TH}$ is the threshold voltage of the field-effect transistors. The capacitance is usually formed by interconnecting the main electrodes of a field-effect transistor). However, at this low supply voltage the charge pump cannot pump much charge (or no charge at all if $V_{DD}<2\ V_{TH}$).

SUMMARY OF THE INVENTION

It is an object of the invention to provide a circuit for generating a substrate bias which does not require a complicated control circuit for generating control pulses of relatively high amplitude (for example, higher than the supply voltage) and which comprises a charge pump which operates efficiently, even at a relatively low supply voltage (for example, fractionally higher than $2\ V_{TH}$).

For that purpose, the invention is characterized in that the switching transistor is connected in series with at least another (i.e. a second) switching transistor whose insulated-gate electrode receives the electrical pulses for the charge pump, the control pulses being applied to the gate electrode of the first-mentioned switching transistor after having been inverted by the control circuit. The control circuit connects the gate electrode of the first-mentioned switching transistor to its main electrode (source) when a control pulse is applied to the control circuit. In the circuit in accordance with the invention, the capacitance of the charge pump is charged to $V_{DD}-V_{TH}$, which is advantageous, especially, at a relatively low supply voltage (for example, 2 or 3 $V_{TH}$). During the pumping cycle of the charge pump a voltage to $-2\ V_{TH}$ can be generated because two transistors, which are diode-connected during the pumping cycle, are arranged in series.

BRIEF DESCRIPTION OF THE DRAWING

The invention will now be described, by way of example, with reference to the accompanying drawing, in which.

DESCRIPTION OF THE PREFERRED EMBODIMENTS

Figure 1:
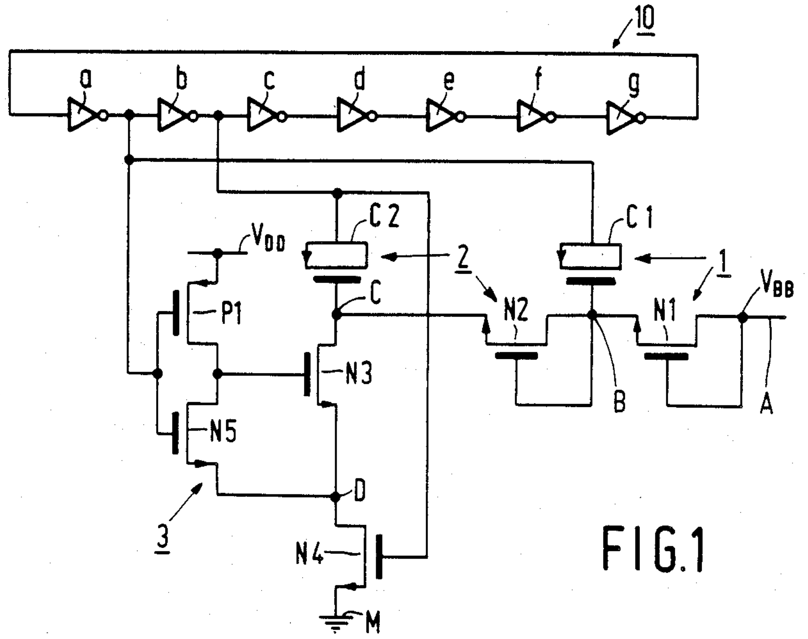
FIG. 1 is an embodiment of the invention.

A circuit for generating a substrate bias, as shown in the relevant Figure, comprises an oscillator 10 for the generation of control pulses, a first and a second charge pump 1 and 2, respectively, and a control circuit 3. Oscillator 10 is a ring oscillator and it comprises seven, known inverting amplifier stages 10*a, b, c, d, e, f* and *g,* which each comprise two complementary field-effect transistors. The output of amplifier stage a is connected to a first electrode of a capacitance C1 of the first charge pump 1, which further comprises a diode-connected field-effect transistor N1 whose control electrode (gate) is connected to a main electrode (drain) and to an output A. Output A of the circuit is connected to the substrate (not shown) on which a further integrated circuit has been provided, for which further circuit the negative substrate bias $V_{BB}$ appearing at output A is generated. Junction point B of capacitance C1 and transistor N1 is connected to the ourput of charge pump 2 which comprises a capacitance C2 and a transistor N2. Transistor N2 is diode-connected in known manner and capacitance C2 receives electrical pulses which appear at the output of the amplifier stage 10*b*. Hence, capacitances C1 and C2 receive (control) pulses which are substantially in phase opposition.

Junction point C of capacitance C2 and transistor N2 is connected to ground point M via two series-connected transistors N3 and N4. A source electrode of transistor N4 is connected to ground point M and the gate electrode is connected to the output of the amplifier stage 10*b*. A main electrode (drain) of transistor N3 is connected to junction point C, the other main electrode (source) of transistor N3 and the main electrode (drain) of transistor N4 are connected to a junction point D. The control electrode (gate) of transistor N3 is connected to the output of control circuit 3 which comprises an inverting amplifier with two complementary transistors P1 and N5, The input of this inverting amplifier is connected to the output of the amplifier stage 10*a*.

The source electrode of transistor P1 is connected to the supply voltage $V_{DD}$ and the source electrode of transistor N5 is connected to junction point D.

The circuit shown operates as follows. If the output of the amplifier stage 10*a* is at a low level (low potential), the output of control circuit 3 and the output of amplifier stage 10*b* will be at a high potential (just below $V_{DD}$). Due to the high potential at its control electrode, transistor N3 will be conductive as will the transistor N4 which receives the high output potential of amplifier stage 10*b* at its control electrode. Since transistors N3 and N4 are conductive, capacitance C2 will be charged. Capacitance C2 (and capacitance C1) is formed in known manner by a field-effect transistor whose main electrodes are interconnected. During the charging of capacitance C2, a charge Q is stored in the said capacitance, $Q=C_2.(V_{DD}-V_{TH})$, where C2 is the value of capacitance C2, $V_{DD}$ is the supply voltage, and $V_{TH}$ is the threshold voltage of the transistor arranged to constitute the capacitance C2. As illustrated, the control electrodes of the transistors which are used as capacitances C1 and C2 are preferably connected to the relevant diode N2 or N1. Preferably, the capacitance C2 (and C1) is constituted by a P-channel transistor, the (inevitable) stray capacitances being connected to the output of amplifier stage 10*b* (and 10*a*, respectively) as shown in the drawing, and not to junction point C (and B). Consequently, they do not load charge pump 2 (and 1), which would be very disadvantageous.

The charging period of capacitance C2 ends as soon as the output level of amplifier stage 10*a* increases from a low potential to a high potential. Transistors P1 and N5 of control circuit 3 will be turned off and turned on, respectively, causing the control electrode and the source electrode of transistor N3 to be interconnected after the control electrode has been disconnected from the power supply $V_{DD}$. The ratio of transistors P1 and N5 is chosen (for example, 2.5/10 and 2/2, respectively) so that the control electrode of transistor N3 is connected to the source electrode thereof prior to the pumping cycle of charge pump 2. The output level of amplifier stage 10*b* will decrease from a high potential to a low potential and, hence, connect, in effect, the control electrode of transistor N4 to ground point M. Junction point C of charge pump 2 is now connected to ground point M via two transistors N3 and N4 which are arranged as diodes. During the pumping cycle, which is effected when the potential at the output of amplifier stage 10*b* goes from a high to a low level, the potential at junction point C will decrease to a level below the ground potential (of ground point M) until the two series-arranged diodes N3 and N4 become conductive. Thus, the negative potential at junction point C is limited to $-2\ V_{THN}$, $V_{THN}$ being the threshold voltage of the N-channel transistors N3 and N4. Further, charge pumps 1 and 2 cooperate in known manner so that they can generate a substrate bias of $-2$ V at a supply voltage $V_{DD}$ of 2 V.

Figure 2:
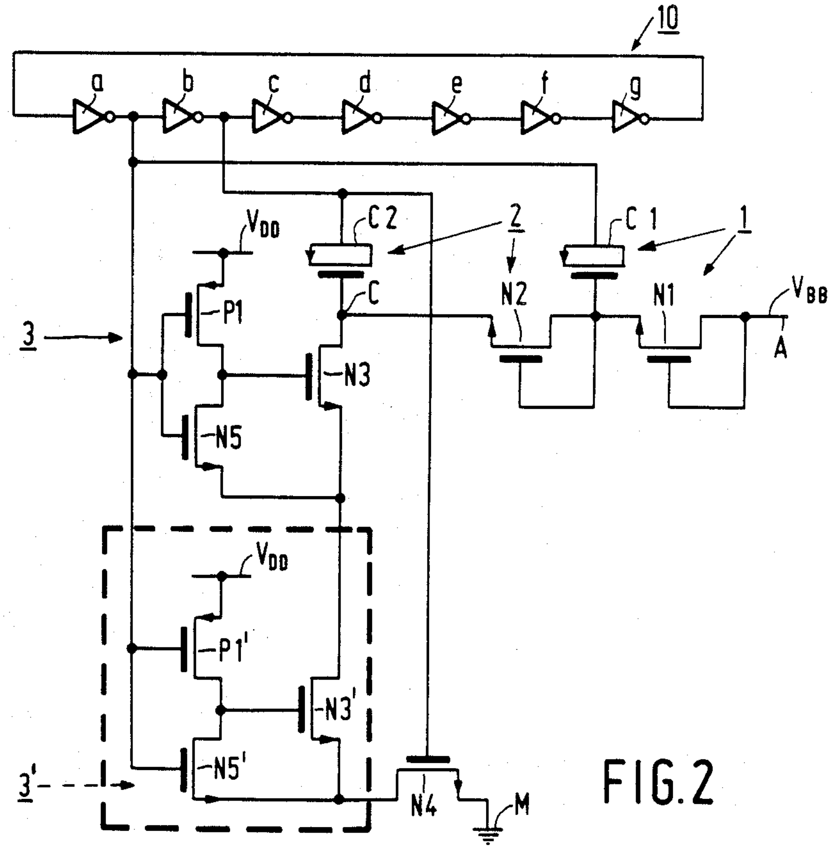
FIG. 2 is a further embodiment of the invention.

FIG. 2 shows a further embodiment of the invention which, apart from an additional part 3', is identical to the circuit shown in FIG. 1. For that reason, all corresponding components of FIGS. 1 and 2 bear the same reference numerals. In FIG. 2, an additional switching transistor N3' has been provided between the switching transistors N3 and N4, and it is controlled in the same way as transistor N3. During the charging period of capacitance C2, the switching transistors N3', N3 and N4 are turned on. The output of amplifier stage 10*a* is at a low potential, hence the control electrodes of switching transistors N3 and N3' are connected to the power supply $V_{DD}$ via the P-channel transistors P1 and P1', respectively. If the output of amplifier stage 10*a* goes from a low to a high level, the transistors P1 and P1' will be turned off and the transistors N5 and N5' will be turned on. This will result in the control electrodes of switching transistors N3 and N3' being connected to the respective source electrodes thereof so that junction point C is connected to ground point M via three diode-connected transistors N3, N3' and N4. The additional part 3' enables the potential at junction point C to decrease to $-3\ V_{TH}$ below ground point potential (M) during the pumping cycle. The use of such an additional part (or two, three etc.) is effective only when the supply voltage $V_{DD}$ is such that $|V_{DD}| \geqq |3\ V_{TH}|$ ($4\ V_{TH}$ or $5\ V_{TH}$ etc.), where $V_{DD}$ is the supply voltage and $3\ V_{TH}$ ($4\ V_{TH}$, $5\ V_{TH}$) is the (maximum) negative voltage of point C at which the three (four, five, etc.) series-arranged, diode-connected transistors (N3, N4, N3''', (N3'', N3'') will become conductive during the pumping cycle.

A circuit for generating a substrate bias in accordance with the invention is used, preferably, in a circuit which is integrated in a semiconductor substrate, which circuit has been fabricated, at least in part, in an N-well on a P-type semiconductor substrate, and which must also remain operative at a low supply voltage of, for example, 2 V. Especially in the case of integrated static-memory circuits, comprising memory cells having high-value resistors and N-channel transistors, the use of the circuit in accordance with the invention is advantageous, as, because of this, the information content of the relevant memory cells is not disturbed by input signals which exhibit undersirable negative voltage peaks (for example, values to $-1$ or $-1.5$ V) as occur in TTL-circuits, which voltage peaks bring about a charge injection in the N-well.

What is claimed is:

1. A circuit for generating a bias voltage for another circuit which is integrated in a semiconductor substrate, comprising: an oscillator for generating control pulses, at least one charge pump which receives electrical pulses derived from the oscillator, said charge pump comprising a series arrangement of a capacitance and a diode in which said electrical pulses are applied to a first electrode of the capacitance, a second electrode of the capacitance being connected to the diode associated with the capacitance, means connecting an output of the charge pump to the substrate, means connecting a junction point of the capacitance and the diode of the charge pump to a ground point of the integrated circuit via first and second series connected insulated-gate switching transistors, said first switching transistor having a control electrode connected to a control circuit which receives the control pulses, said second switching transistor having a control electrode which receives the electrical pulses for the charge pump, the control pulses being applied to the control electrode of the first switching transistor after having been inverted by the control circuit, and wherein the control circuit includes a transistor that effectively connects the control electrode of the first switching transistor to one main electrode of the first switching transistor when a control pulse is applied to the control circuit.

2. A circuit as claimed in claim 1, wherein the capacitance comprises an insulated-gate transistor connected to the diode and having first and second main electrodes interconnected, the pulses being applied to the interconnected main electrodes thereof.

3. A circuit as claimed in claim 2, characterized in that the capacitance comprises a transistor of the P-conductivity type.

4. A circuit as claimed in claim 1, 2 or 3, characterized in that the diode comprises a diode-connected transistor of the same conductivity type as the first and second switching transistors, wherein the control circuit includes an inverting amplifier comprising an N-type output transistor having a channel connecting the control electrode of the first switching transistor to said one main electrode of the first switching transistor.

5. A circuit as claimed in claim 4, characterized in that the oscillator comprises a ring oscillator, the inverting amplifier further comprises a transistor of the P-conductivity type having a channel connected to the control electrode of said first switching transistor and to a power-supply terminal, means connecting the control electrodes of the P-channel and the N-channel transistor of the inverting amplifier to a first output of the ring oscillator which includes an odd number of inverting amplifiers which comprise complementary insulated-gate transistors, the electrical pulses being formed by inverting the control pulses by means of a single complementary amplifier.

6. A circuit as claimed in claim 1 comprising a further charge pump which comprises a series arrangement of a capacitance and a diode with a junction point connected to the output of the first charge pump, and wherein the control pulses are applied to the capacitance of the further charge pump and the output of the further charge pump is connected to the substrate.

7. An integrated circuit on a semiconductor substrate provided with a circuit for generating a substrate bias voltage as claimed in claim 1.

8. An integrated circuit as claimed in claim 7, characterized in that at least a part of the circuit is formed in an N-type well (or N-type pocket) on a P-type semiconductor substrate.

9. An integrated circuit as claimed in claim 8, characterized in that the integrated circuit comprises memory cells having low-value resistors and transistors of the N-channel conductivity type.

10. An integrated memory circuit having rows and columns of memory cells on a semiconductor substrate provided with a circuit for generating a substrate bias voltage as claimed in claim 1.

11. A semiconductor substrate bias voltage generator comprising: means for generating control pulses, a charge pump including a series connection of a capacitor and a diode in which electric pulses derived from the means for generating control pulses are applied to a first electrode of the capacitor, a second electrode of the capacitor being connected to the diode to form a junction point, means for coupling an output of the charge pump to the substrate, first and second series connected field effect switching transistors connected between said junction point and a ground point of an integrated circuit in the semiconductor substrate, a control circuit having an input responsive to the control pulses and an output coupled to a control electrode of the first field effect switching transistor, said control circuit applying inverted control pulses to the control electrode of the first switching transistor, second means for coupling said electric pulses to a control electrode of the second field effect switching transistor, and wherein the control circuit includes means for effectively interconnecting the control electrode and one main electrode of the first switching transistor in response to said control pulses.

12. A bias voltage generator as claimed in claim 11, wherein the control circuit comprises third and fourth complementary type field effect transistors connected in series between a d.c. supply voltage terminal and a common junction point between the first and second field effect switching transistors and with the control electrode of the first field effect switching transistor connected to a common junction point between the third and fourth transistors, said control pulses being operative via the control circuit and during a pumping cycle of the charge pump so as to produce a negative voltage at the junction point of the diode and capacitor limited to the sum of the threshold voltages of the first and second transistors.

13. A bias voltage generator as claimed in claim 11, wherein the first and second field effect switching transistors are connected in a further series circuit with the capacitor so as to form a charge path for the capacitor which is controlled by said control circuit.

14. A bias voltage generator as claimed in claim 11, wherein said control pulse generating means includes first and second outputs supplying complementary control pulses, said first output being coupled to the input of the control circuit and the second output being coupled to the first electrode of the capacitor and to the control electrode of the second field effect switching transistor.

15. A bias voltage generator as claimed in claim 11, wherein said output coupling means comprises a second charge pump including a series connection of a second capacitor and a second diode in which pulses derived from the means for generating control pulses are applied to a first electrode of the second capacitor, a second electrode of the second capacitor being connected to the second diode to form a second junction point connected to an output of the first charge pump, and wherein an output of the second charge pump is coupled to said substrate.

16. A bias voltage generator as claimed in claim 15, wherein said control pulse generating means includes first and second outputs supplying complementary control pulses, said first output being coupled to the input of the control circuit and to the first electrode of the second capacitor and the second output being coupled to the first electrode of the first capacitor and to the control electrode of the second field effect switching transistor.

17. A bias voltage generator as claimed in claim 11, wherein the control circuit comprises an inverting amplifier including third and fourth complementary type field effect transistors having their control electrodes connected together to an output of said control pulse generating means and with a common junction point between the third and fourth transistors operative as the control circuit output which is coupled to the control electrode of the first field effect switching transistor.

18. A bias voltage generator as claimed in claim 17, wherein the control pulses applied to the control circuit input and to the control electrode of the second field effect switching transistor are operative to turn on the first and second field effect switching transistors at the same time so as to provide a charge path for the capacitor of the charge pump.

19. A bias voltage generator as claimed in claim 11, wherein said control pulse generating means includes first and second outputs supplying control pulses in phase opposition, and wherein said output coupling means comprises a second charge pump including a series connection of a second capacitor and a second diode, wherein the control pulses at the first and second outputs of said control pulse generating means are applied to the first electrode of the first capacitor and to a first electrode of the second capacitor, respectively, a second electrode of the second capacitor being connected to the second diode to form a second junction point connected to an output of the first charge pump, and wherein an output of the second charge pump is coupled to said substrate.

* * * * *